United States Patent [19]

Frank et al.

[11] Patent Number: 5,466,972
[45] Date of Patent: Nov. 14, 1995

[54] METALLIZATION FOR POLYMER-DIELECTRIC MULTICHIP MODULES INCLUDING A TI/PD ALLOY LAYER

[75] Inventors: Aaron L. Frank, Malden, Mass.;
Ajibola O. Ibidunni, Litchfield, N.H.;
Douglas B. Johnson, Hampstead, N.H.;
Dennis L. Krause, Atkinson, N.H.;
Trac Nguyen, Haverhill, Mass.

[73] Assignee: AT&T Corp., Murray Hill, N.J.

[21] Appl. No.: 239,797

[22] Filed: May 9, 1994

[51] Int. Cl.[6] .......................... H01L 29/46; H01L 29/54; H01L 29/62
[52] U.S. Cl. .......................... 257/764; 257/763; 257/770; 257/753; 257/750
[58] Field of Search .......................... 257/741, 750, 257/753, 763, 764, 770, 768, 769

[56] References Cited

U.S. PATENT DOCUMENTS

| | | | |
|---|---|---|---|
| 4,016,050 | 4/1977 | Lesh et al. | 204/15 |
| 4,109,297 | 8/1978 | Lesh . | |
| 4,554,229 | 11/1985 | Small, Jr. | 430/17 |
| 4,601,972 | 7/1986 | Small, Jr. . | |
| 5,288,951 | 2/1994 | Frankenthal et al. | 174/257 |

OTHER PUBLICATIONS

"Indentation–Debonding Test For Adhered Thin Polymer Layers," by Engel et al., *Adhesion Aspects of Polymeric Coatings*, (1983) pp. 583–595.

*Primary Examiner*—Jerome Jackson
*Assistant Examiner*—Nathan Kip Kelley
*Attorney, Agent, or Firm*—Oleg E. Alber

[57] ABSTRACT

Multilayer circuit devices include a plurality of metallized patterns thereon, said patterns being separated by a polymeric dielectric film. The various metallized patterns are interconnected by means of microvias through the polymeric film or films. Each of the metallizations is a composite including in succession from the substrate or from the polymeric film, a layer of titanium (Ti), a layer of titanium and palladium alloy (Ti/Pd), a layer of copper (Cu), and a layer of titanium and palladium alloy (Ti/Pd). The Ti—Ti/Pd—Cu—Ti/Pd composite is hereinafter referred to as TCT. The adhesion between the polymeric film and the top Ti/Pd layer is better than that between the polymer and gold (Au) and comparable to that between the polymer and an adhesion promoted Au layer. Use of the TCT metallization also results in additional cost reduction due to the elimination of Ni and Au layers on top of the Cu layer.

8 Claims, 2 Drawing Sheets

METALLIZATION FOR POLYMER-DIELECTRIC MULTICHIP MODULES INCLUDING A TI/PD ALLOY LAYER

TECHNICAL FIELD

This invention concerns multilayer hybrid integrated circuits.

BACKGROUND OF THE INVENTION

In the evolution of hybrid integrated circuits for switching systems and high performance processes, as well as other electronic devices, one of the most critical system-packaging needs is the capability of utilizing effectively high input/output (I/O) devices with high speed interconnections. Richard D. Small, Jr. discloses in U.S. Pat. Nos. 4,554,229 and 4,601,972 a multilayer circuit device comprising a substrate having a metallized pattern thereon and a plurality of superposed polymeric dielectric film layers each having a metallized circuit pattern thereon with metallized microvias interconnecting the metallized patterns of one layer with that of at least one other metallized pattern thereunder.

Presently a metallized pattern disclosed in U.S. Pat. Nos. 4,016,050 and 4,109,297 issued to N. G. Lesh et al. and in U.S. Pat. No. 5,288,951 issued to R. P. Frankenthal et al. utilizes composite metallizations. Lesh et al. disclose a composite metallization including, in succession from an insulating substrate, Ti—Cu—Ni—Au and Ti—Pd—Cu—Ni—Au layers, respectively. Frankenthal et al. disclose composite metallization including, in succession from the substrate, Ti—Ti/Pd—Cu—Ni—Au layers. However, whenever these composite metallizations are being used for fabrication of multilayer circuit devices with polymeric dielectric films, their use presents a problem. The problem resides in poor adherence of the polymeric dielectric films to the metal composite metallization, and especially to the top gold layer of the composite.

Improvement in adhesion was attempted by promoting adhesion of the dielectric film to the gold layer in a variety of ways. One of the ways included sputtering of Ti layer on top of the gold or gold and nickel pattern and processing of the Ti layer to convert Ti to titanium oxide that improves the bonding between the metallization and the polymeric dielectric. However, this process is time consuming and costly. Therefore, elimination of at least this adhesion promotion process could lead to simplification of the formation of the multilayer circuit devices and viable cost reduction.

SUMMARY OF THE INVENTION

This invention embodies multilayer circuit devices including a plurality of metallized patterns thereon, said patterns being separated by a polymeric dielectric film. The various circuit patterns are interconnected by means of microvias through the polymeric film or films. The metallization is a composite including in succession from the substrate or from the polymeric film, a layer of titanium (Ti), a layer of titanium and palladium alloy (Ti/Pd), a layer of copper (Cu), and a layer of titanium and palladium alloy (Ti/Pd). The Ti—Ti/Pd—Cu—Ti/Pd composite is hereinafter referred to as TCT. The adhesion between the polymeric film and the top Ti/Pd layer is better than that of the polymer to gold or to gold and nickel and comparable to that between the polymer and the adhesion promoted gold Au layer. Use of the TCT metallization also results in additional cost reduction to the elimination of Ni and Au layers on top of the Cu layer.

BRIEF DESCRIPTION OF THE DRAWING(S)

DETAILED DESCRIPTION

Figure 1:
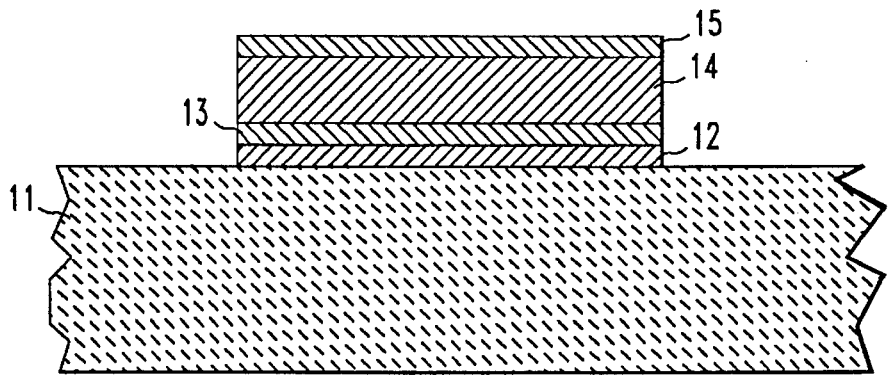
FIG. 1 is a crossectional view of a portion of a metallization according to this invention.

Shown in FIG. 1 is a crossection view of a composite metallization, 10, embodying this invention. The metallization is upon a substrate, 11, of a dielectric material such as ceramic or a synthetic organic polymer such as fiberglass reinforced epoxy. The metallization is built up in layers, including, in an ascending order from substrate 11, a titanium layer, 12, a titanium-palladium layer, 13, a copper layer, 14, and a titanium-palladium layer, 15. The titanium-palladium layer is a sputtered mixture containing from 0.3 to 14 weight percent palladium, remainder titanium. Hereinafter, this composite metallization shall be referred to as Ti—Ti/Pd—Cu—Ti/Pd or TCT.

The metallization is produced by depositing in succession from substrate 11, a layer of titanium 200 to 600 nm thick, a layer of titanium-palladium alloy 200 to 600 nm thick, a layer of copper 500 to 10,000 nm thick and a layer of titanium-palladium alloy 200 to 600 nm thick. This metallization pattern may be formed by any of the well known techniques, including thin film technology, thick film technology, vacuum evaporation, sputtering and electroless plating techniques. The titanium and titanium-palladium alloys are preferably deposited by sputtering. The copper conductor layer can be deposited by sputtering, electro-or electroless plating, and chemical vapor deposition. The thickness of the copper conductor is dictated by performance and design. In the process described in the Lesh et al., and Frankenthal et al., patents, the copper layer is deposited in two stages. First a Cu layer from 300 to 700, preferably 500 nm in thickness is deposited by sputtering on the titanium-palladium layer 13, followed by electroless or electro-plating deposition of an additional thickness of copper up to the thickness ranging from 500 to 10,000 nm. The conditions for sputtering and plating of the various metal layers are known to artisans and from above mentioned U.S. Pat. Nos. 4,016,050, 4,109,297 and 5,288,951 and need not to be specifically recited. Each of these patents is incorporated herein by reference.

Figure 2:
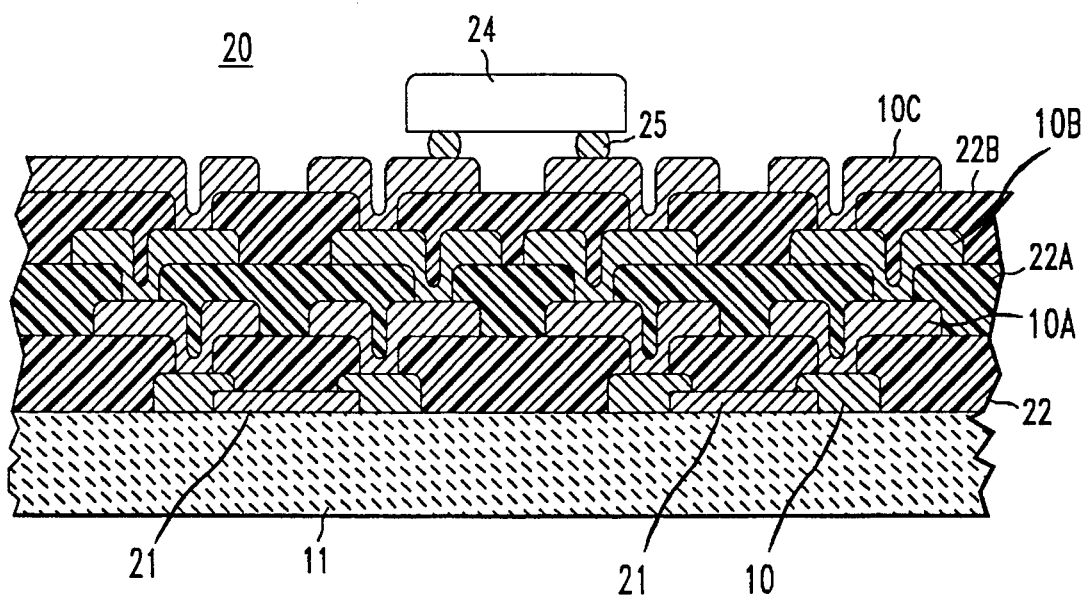
FIG. 2 is a crossectional view of an exemplary multi-layer circuit with metallizations shown in FIG. 1.

FIG. 2 depicts a crossectional schematic view of an exemplary multilayer circuit, designated generally as 20. The circuit is built on dielectric substrate 11, having metallizations, 10 thereon. Thin film devices, such as resistors 21 or capacitors (not shown) are in contact with some of the metallizations 10. Polymer layers, 22, 22A, 22B, separate metallization 10, on the substrate, from additional levels of the metallizations, 10A, 10B, 10C. Vias 23, which are through-plated, connect the various levels of metallizations each to another, as needed. An exemplary integrated circuit (IC) unit, 24, is mechanically and electrically connected by means of solder bumps, 25, to upper level metallization 10C. While only three additional levels of metallizations (10A, 10B and 10C) and dielectric layers (22, 22A and 22B) are shown, additional levels of metallizations and dielectric layers may be provided as needed. When fabricating the multilayer structure, metallization 10 may be deposited as described above, while the subsequent metallizations 10A, 10B and 10C are deposited by sputtering. Alternatively, all of the metal layers of the TCT metallization may be deposited by sputtering.

Figure 3:
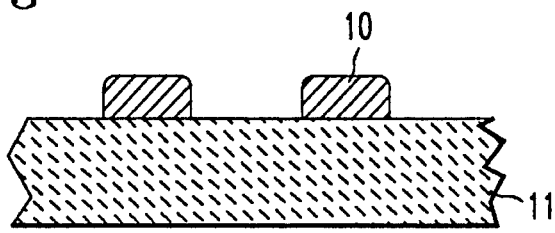
FIG. 3–6 illustrate the process of producing the multilayer circuit using the metallizations shown in FIG. 1. For illustration purposes various dimensions are not to scale.

Shown in FIGS. 3–6 is a cross-sectional view representing processing steps in forming the device with from one to more than one additional metallization steps. In FIG. 3 is shown substrate, 11, such as an alumina ceramic substrate, with a portion of a metallization pattern, 10, on one surface thereof. While the conductor pattern is shown as patterned to form a circuit, one may employ a blanket metallized layer which may be used as a ground or power plane for devices to be attached.

Figure 4:
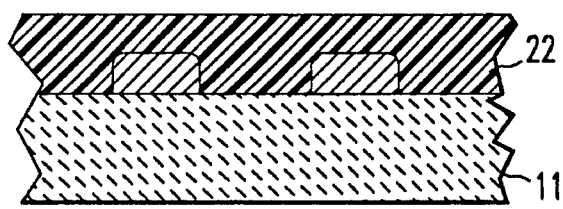
Figure 5:
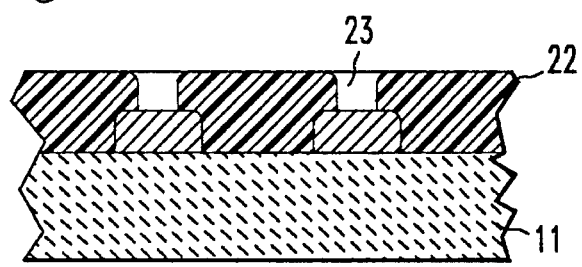
Figure 6:
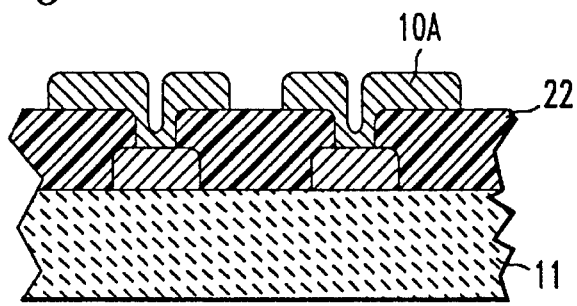

FIG. 4 depicts a photodefinable dielectric layer, 22, applied over substrate 11 and metal pattern 10. The dielectric layer may be applied by any of the well known techniques including screen printing, brushing, spraying, dipping or the like. Subsequent to application of the photodefinable dielectric layer, 22, the dielectric layer is subjected to actinic radiation followed by development to form microvias, 23 (FIG. 5). These microvias allow connection of an additional level of metallization 10A, formed on top of dielectric layer 22, as shown in FIG. 6, with a contact between adjacent metallized layers 10 and 10A. In this way any desired portions of a top metallized layer may be made electrically contacting any lower metallized layer.

Steps of FIGS. 3–6 may be repeated to build as many levels as needed or desired forming a multilevel device, such as device 20 shown in FIG. 2. Discrete devices, such as integrated circuit chips, resistors, capacitors may be electrically connected, such as by surface mounting techniques or any other available techniques known to the art, to any of metallization layers or, preferentially, to the top layer.

The polymer layer must act as a dielectric material between layers containing thin film circuitry, have a high $T_g$, a high thermal stability, hybrid process compatibility, and be preferably photodefinable. One of such polymeric dielectric materials is formed from a photodefinable triazine base mixture including a photosensitive acrylate moiety, wherein the triazine comprises 40–65 weight percent of the mixture. For more details see U.S. Pat. Nos. 4,554,229 and 4,601,972 issued to Richard D. Small, Jr, each of which is incorporated herein by reference.

Adhesion of the polymer to the metal is tested by a spallation testing process. The spallation testing was conducted under conditions described in an article by P. A. Engel and G. C. Pedroza, "Indentation-Debonding Test for Adhered Thin Polymer Layers" in "Adhesion Aspects of Polymeric Coatings", edited by K. L. Mittel, Plenum Press, 1985, pages 583–595. In this testing process a truncated conical needle 0.35 millimeters (mm) in diameter at apex and having an angle of 60° from its longitudinal axis is placed in contact with a surface of the polymer overlaying a metal conductor. Upon application of a certain indentation load to the needle, a diameter of an area of separation of the polymer from the metal is measured and acts as a measure of an adhesion strength on the interface. The spall diameter, due to the delamination between the polymer and the metal when an indentation load is applied to the polymer surface, is related to the adhesion strength of the interface.

To test adhesion of the polymer to the TCT metallization, a polymer layer 50 micrometers thick was deposited on the metallization. Prior to the polymer layer deposition the TCT metallization was cleaned by immersion in 6% $H_2O_2$ at 75° C. for 10 minutes. The test was conducted under application of a 25 lb. load to the needle. When subjected to the spalling testing under load the TCT metallization-polymer composite showed no spall.

In comparison, metal surfaces of several metals, commonly used in the metallization techniques in contact with the polymeric material, when subjected to the spalling test exhibited poor adhesion between the contacting surfaces. Some of these metal surfaces were as deposited and cleaned and some were treated prior to the deposition of the polymer layer thereon. For example, a metallization with a gold surface showed a spall ranging from 41.1 to 47.2 mills in diameter. Other metal surfaces selected from among palladium, chromium (sputtered and plated), and nickel (electroless and electroplated) were also subjected to the spalling testing. Some of these underwent adhesion promotional treatment including oxygen plasma, 125° or 200° C. bake, immersion into 6% $H_2O_2$ at 75° C. for 10 minutes, and some did not. These metals showed inferior adhesion with spall diameter ranging from a low of 28 to a high of 61 mills in diameter, with some of the metals showing spalling defects, e.g., Cr, in the lower end of the range while some of the other metals, e.g., Ni, consistently showing defects toward the upper end of the range.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A circuit including thin film elements and electrical interconnections on the major surface of an insulating substrate, said interconnections comprising in an ascending order from the substrate a first metal layer comprising titanium;

a second metal layer comprising an alloy of titanium and palladium, said alloy comprising 0.3 to 14 weight percent palladium based on the weight of the alloy;

a third metal layer comprising copper; and a fourth metal layer comprising an alloy of titanium and palladium, said alloy comprising 0.3 to 14 weight percent palladium based on the weight of the alloy.

2. A circuit of claim 1, in which said first metal layer has a thickness within the range of 200 to 600 nm, said second metal layer has a thickness within the range of 200 to 600 nm, said third metal layer has a thickness within the range of 500–10,000 nm, and said fourth metal layer has a thickness within the range of 200–600 nm.

3. A circuit of claim 1 wherein the fourth metal layer is formed on substantially the entire surface of said third metal layer.

4. A multilayer circuit device comprising a substrate having a metallized pattern thereon and at least one polymeric dielectric layer thereon, each one of said polymeric layers having a metallized circuit pattern thereon with metallized microvias interconnecting the metallized pattern of one layer with at least one other metallized pattern thereunder, each of said metallized patterns being a composite comprising in an ascending order a first metal layer comprising titanium;

a second metal layer comprising an alloy of titanium and palladium said alloy comprising 0.3 to 14 weight percent palladium based on the weight of the alloy;

a third metal layer comprising copper; and a fourth metal layer comprising an alloy of titanium and palladium, said alloy comprising 0.3 to 14 weight percent palladium based on the weight of the alloy.

5. A multilayer circuit of claim 4, in which said first metal layer has a thickness within the range of 200 to 600 nm, said second metal layer has a thickness within the range of 200 to 600 nm, said third metal layer has a thickness within the range of 500–10,000 nm, and said fourth metal layer has a thickness within the range of 200–600 nm.

6. A multilayer circuit of claim 4, in which the fourth metal layer is formed on substantially the entire surface of said third metal layer.

7. A multilayer circuit of claim 4, in which each one of said polymeric layers is formed from a photodefinable triazine based mixture wherein said triazine comprises from 40 to 65 weight percent of the mixture.

8. A multilayer circuit of claim 7, in which said triazine base mixture includes a photosensitive acrylate moiety.

* * * * *